United States Patent
Kneer

(10) Patent No.: US 7,700,534 B2
(45) Date of Patent: Apr. 20, 2010

(54) PROCESS FOR REMOVING CONTAMINANT FROM A SURFACE AND COMPOSITION USEFUL THEREFOR DESCRIPTION

(75) Inventor: Emil Anton Kneer, Leuven (BE)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 12/052,806

(22) Filed: Mar. 21, 2008

(65) Prior Publication Data

US 2008/0167209 A1 Jul. 10, 2008

Related U.S. Application Data

(62) Division of application No. 10/652,308, filed on Sep. 2, 2003, now Pat. No. 7,524,801, which is a division of application No. 09/893,968, filed on Jun. 29, 2001, now Pat. No. 6,627,546.

(51) Int. Cl.
*H01L 21/02* (2006.01)

(52) U.S. Cl. .................. 510/175; 252/79.1

(58) Field of Classification Search ............. 510/175; 252/79.1
See application file for complete search history.

(56) References Cited

U.S. PATENT DOCUMENTS

| | | | |
|---|---|---|---|
| 5,662,769 A | | 9/1997 | Schonauer et al. |
| 5,770,095 A | | 6/1998 | Sasaki et al. |
| 5,807,493 A | * | 9/1998 | Maki et al. ............... 216/106 |
| 6,033,993 A | * | 3/2000 | Love et al. ............... 438/745 |
| 6,174,561 B1 | | 1/2001 | Taylor |
| 6,248,704 B1 | | 6/2001 | Small et al. |
| 6,274,059 B1 | | 8/2001 | Krusell et al. |
| 6,303,551 B1 | * | 10/2001 | Li et al. ................... 510/175 |
| 6,395,693 B1 | | 5/2002 | Wang |
| 6,413,923 B2 | * | 7/2002 | Honda et al. ............. 510/175 |
| 6,455,432 B1 | | 9/2002 | Tsai et al. |
| 6,527,818 B2 | * | 3/2003 | Hattori et al. ............ 51/308 |
| 6,546,939 B1 | | 4/2003 | Small |
| 6,673,757 B1 | | 1/2004 | Kneer |
| 6,896,825 B1 | * | 5/2005 | Uchida et al. ............ 252/79.1 |

FOREIGN PATENT DOCUMENTS

| | | |
|---|---|---|
| EP | 0812011 | 12/1997 |
| EP | 0897975 | 2/1999 |
| FR | 2722511 | 7/1995 |
| JP | 59-164398 | 9/1984 |
| JP | 02-225684 A | 9/1990 |
| JP | 6-248480 | 9/1994 |
| JP | 9-508437 | 8/1997 |
| JP | 9-508930 | 9/1997 |
| WO | 95/21229 | 8/1995 |
| WO | 95/21232 | 8/1995 |
| WO | 0072363 | 11/2000 |
| WO | 0124242 | 4/2001 |

OTHER PUBLICATIONS

Stanley Wolf, Silicon Processing for the VLSI Era, vol. 1: Process Technology, (1998), p. 519.

* cited by examiner

*Primary Examiner*—Gregory E Webb
(74) *Attorney, Agent, or Firm*—Lina Yang

(57) ABSTRACT

Particulate and metal ion contamination is removed from a surface, such as a semiconductor wafer containing copper damascene or dual damascene features, employing a fluoride-free aqueous composition comprising a dicarboxylic acid and/or salt thereof; and a hydroxycarboxylic acid and/or salt thereof or amine group containing acid.

7 Claims, No Drawings

PROCESS FOR REMOVING CONTAMINANT FROM A SURFACE AND COMPOSITION USEFUL THEREFOR DESCRIPTION

CROSS-REFERENCE TO RELATED APPLICATIONS

This application is a division of application Ser. No. 10/652,308 filed on 9 Feb. 2003, now U.S. Pat. No. 7,524,801; which is a division of application Ser. No. 09/893,968 filed on 29 Jun. 2001, now U.S. Pat. No. 6,627,546.

BACKGROUND OF THE INVENTION

The present invention relates to an acidic aqueous composition that is especially useful for removing particulate and metallic contamination from a surface. The present invention is especially useful for removing particulate and metallic contaminants from structures such as those used as interconnect structures in integrated circuit devices such as semiconductor wafers containing copper damascene and dual damascene features. The structures treated according to the present invention include those that have been previously planarized by chemical mechanical polishing.

On VLSI and ULSI semiconductor chips, Al and alloys of Al are used for conventional chip interconnect wiring material. However, more recently copper and alloys of copper have been developed as chip interconnect material. The use of copper and copper alloys results in improved device performance when compared to Al and its alloys.

In the fabrication of semiconductor devices, the metallic interconnect material or wiring such as the copper or its alloys is typically planarized after deposition.

Polishing slurries used for this planarization are typically aqueous suspensions comprised of a metal oxide abrasive (such as alumina), organic acids, surfactants, and a suitable oxidizing agent. This process is known as chemical-mechanical polishing (CMP). The oxidizing agent works to enhance mechanical removal of material via a corrosion assisted process. Such oxidizing agents employed in commercially-available or proprietary slurries are typically inorganic metal salts such as $FeNO_3$, or $KIO_3$, and also hydrogen peroxide, present in significant concentrations. Other chemicals added to slurries to improve dispersion or otherwise enhance performance often are organic acids (e.g. citric acid). Sodium, potassium, and iron salts and/or compounds are frequently used in slurry formulations, and significant amounts of these metal ion impurities can remain on the wafer after polishing and post-polish cleaning.

Therefore, a tendency exists for various particulate contaminants to remain on the polished surface. The particulate materials are extremely difficult to remove. This is particularly problematic since the removal must not adversely affect the polished surface.

Furthermore, since the polishing slurries typically contain an oxidizing agent, an oxide layer usually is present on the copper due to oxidization of the copper during the CMP process. This layer may adversely affect the electrical characteristics of the device, and is preferably removed. In fact, this layer may also contribute to the contamination.

Accordingly, a need exists for a post chemical mechanical polishing cleaning chemistry that removes metallic and particulate contamination. In addition, it is desired that the cleaning step remove any residual copper oxides and/or other non-desirable surface films, leaving a bare copper surface.

The problems of developing such a cleaning is further exacerbated by the need to minimize etching of the copper as well as avoiding increased surface roughness to any significant extent.

Moreover, compositions containing fluorides have been suggested. However, it has become desirable to provide fluoride-free compositions due to environmental considerations.

BRIEF SUMMARY OF THE INVENTION

The present invention relates to an acidic aqueous solution that is especially for cleaning metallic/metal ion contaminants and especially metal and non-metal oxide particles remaining at or in the surface of a semiconductor wafer following CMP.

The present invention is particularly useful for removing particulate contaminants from copper. The present invention also removes any residual oxide layer found on the copper surface without etching or increasing the surface roughness of the copper to any significant extent.

In particular, the present invention relates to a fluoride-free aqueous composition comprising about 0.005 to about 16% by weight of at least one dicarboxylic acid, salt thereof or mixture thereof, about 0.003 to about 4% by weight of at least one hydroxy carboxylic acid, salt thereof or mixture thereof; or an amine group-containing acid and the remainder being substantially water, and having a pH of about 1 to about 4.

A further aspect of the present invention is concerned with a process for removing particulate contaminants from a copper surface after CMP planarization. In particular, the process comprises contacting a copper surface that has been planarized by CMP with one of the above-disclosed aqueous compositions.

A still further aspect of the present invention relates to a process for fabricating semiconductor integrated circuits. The process comprises forming circuits on the surface of a semiconductor wafer by photolithographic process wherein the circuits comprise copper or copper alloy; planarizing the surface by chemical mechanical polishing; and removing particulate and metallic (e.g.—metal ion) contaminants from the surface by contacting with one of the above-disclosed aqueous compositions.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

DETAILED DESCRIPTION OF THE INVENTION

A number of criteria must be considered to establish an acceptable wafer cleaning process. In particular, the ideal cleaning process should reduce particulate and metallic contaminants on the wafer to the level present before the polishing step. Also, the cleaning process and chemistry must be compatible with the materials exposed on the wafer surface after CMP. Furthermore, one should be able to perform the cleaning process safely using commercially available wafer or fabrication equipment. Moreover, it is desirable that the process be relatively inexpensive to implement. Furthermore, environmental considerations make it desirable that the composition be fluoride-free.

The structures treated pursuant to the present invention are typically semiconductor devices having copper interconnects (lines, plugs, vias, global and local interconnects) imbedded into a low k dielectric material such as silicon dioxide, which may also include a capping layer, such as silicon nitride as in low k dielectric/damascene and dual damascene structures. The silicon dioxide is typically a high density plasma deposited silicon dioxide or TEOS (tetraethylorthosilicate).

The copper interconnects typically use either tantalum, tantalum nitride, or titanium or titanium nitride as a barrier or liner material between the copper and the dielectric. As such, the post-CMP cleaning solution is meant to clean up to four or more different materials, copper, the liner material, the dielectric or capping layer, as well as the wafer backside, which is generally a thin layer of oxidized silicon. All these types of materials are exposed on the surface of the semiconductor device during post-CMP cleaning. Accordingly, the cleaning composition must not adversely effect any of these materials to an undesired degree while still effectively removing the contaminants. This places considerable constraints upon developing a suitable composition.

The copper is planarized after deposition by chemical mechanical polishing typically employing an aqueous slurry comprising an abrasive and an oxidizing agent. Such compositions are well known and need not be described in any detail herein. Examples of some chemical mechanical polishing slurries can be found in U.S. Pat. No. 5,527,423 and U.S. Pat. No. 5,693,239, and PCT publication WO 97/43087, disclosures of which are incorporated herein by reference.

The structure is then contacted with a fluoride-free aqueous composition according to the present invention. The composition comprises at least one dicarboxylic acid and/or salt thereof; and at least one hydroxycarboxylic acid and/or salt thereof; or an amine group containing acid.

Use of the term "fluoride-free" herein refers to at least substantially fluoride-free (e.g. containing no more than about 100 ppb of fluoride). Typical dicarboxylic acids include those having two to six carbon atoms, and include oxalic acid, malonic acid, succinic acid, glutaric acid, adipic acid, maleic acid and fumaric acid. The preferred acid is malonic acid. Suitable salts include the alkali metal, alkaline earth metal and ammonium salts. Preferably, a mixture comprising malonic acid and oxalic acid is employed.

Examples of hydroxycarboxylic acids includes malic acid, tartaric acid and citric acid.

The preferred hydroxycarboxylic acid is citric acid. Suitable salts include alkali metal, alkaline earth metal and ammonium salts.

A preferred derivative is ammonium citrate.

The amine-containing acid is preferably glycine.

In addition to water, preferably deionized water, the composition can include minor amounts (e.g. up to about 0.002% by weight of the active portion) of a biocide. A typical biocide is Kathan. Kathan comprises:

1.2% 5-chloro-2-methyl-4-isothiazolin-3-one
0.4% 2-methyl-4-isothiazolin-3-one
1.1% $MgCl_2$
1.75% $Mg(NO_3)_2$
0.16% copper nitrate trihydrate
water 95.85%.

The dicarboxylic acid and/or salt is typically present in amounts of about 0.005 to about 16 weight %, more typically about 0.1 to about 3 weight % and preferably about 0.3 to about 0.5 weight %. When the preferred mixture of oxalic acid and malonic acid is used, each one is typically present in amounts of about 0.003 to about 8 weight %, more typically about 0.05 to about 1.5 weight % and preferably about 0.1 to about 0.3 weight %.

The hydroxycarboxylic acid is typically present in the composition at amounts of about 0.003% to about 8% by weight, more typically about 0.05 to about 1.5 weight % and preferably about 0.1% to about 0.3% by weight.

When employed, the amino-group containing acid such as glycine is typically employed in amounts of about 0.003 to about 4% by weight, more typically about 0.005 to about 1.5 weight % and preferably about 0.005 to about 0.05% by weight.

In addition, the compositions of the present invention have a pH of about 1 to about 4 and preferably about 1 to about 3, a particular example being about 2. The pH is typically measured using pH paper or suitable pH reference electrode. It has been discovered according to the present invention that the pH is important in achieving objectives of the present invention. In particular, the compositions are capable of removing metallic and non-metallic particulate oxides, as well as silicon dioxide; metal ion contaminants such as K, Ca, Ti, Cr, Mn, Fe, Ni, Cu and Zn; various sulfur and chloride impurities adsorbed on the various surface materials present on the wafer. CuO is thermodynamically unstable within the pH range of the compositions of the present invention.

A further feature of the present invention is that the composition even in concentrated form is relatively stable. For instance, concentrates of the composition comprising about 0.1 to about 16% by weight and preferably about 6% to about 10% by weight of the dicarboxylic acid, about 0.05% to about 8% by weight, and preferably about 3% to about 5% by weight of the dihydroxy carboxylic acid or amino acid and the remainder being substantially water can be provided and transported to the end user, the user can then dilute it such as about a 19:1 dilution by weight at the process tool for convenience and for economical reasons.

The composition can be used in a double sided brush scrubber to clean whole wafers following a copper CMP polishing step. Moreover, such can be used in a megasonic bath or spray tool cleaning apparatus, or combination thereof.

The following non-limiting examples are presented to further illustrate the present invention.

Example 1

A concentrate comprising about 160 grams of citric acid, about 80 grams of malonic acid, about 160 grams of oxalic acid and about 10 grams of Kathon™ biocide with about 3590 grams of ultra-high purity (UHP) water is prepared. The concentrate has pH of about 1.05 as measured using a calibrated antimony reference electrode or pH paper. The concentrate is then diluted 19:1 (by weight) with UHP $H_20$ to formulate an aqueous cleaning mixture, containing about 0.2 weight % of citric acid, about 0.1 weight % of malonic acid, about 0.2 weight % oxalic acid, about 0.0125 weight % Kathon™ biocide and about 99.5 weight % of water.

Wafers having copper lines embedded into silicon dioxide and lines with a liner material are first subjected to CMP employing an aqueous slurry comprising about 2% by weight alumina, about 3% by weight $H_2O_2$, with the remainder being water and minor additives. After the CMP, the wafers are contacted with the above aqueous cleaning mixture.

Example 2

A concentrate comprising about 200 grams of oxalic acid, about 80 grams of malonic acid, about 200 grams of glycine with about 3510 grams of ultra-high purity (UHP) water is prepared. The concentrate has pH of about 2.15 as measured using a calibrated antimony reference electrode or pH paper. The concentrate is then diluted 19:1 (by weight) with UHP $H_2O$ to formulate an aqueous cleaning mixture containing about 0.25 weight % of oxalic acid, about 0.1 weight % of malonic acid, about 0.25 weight % glycine and about weight 99.4% of water.

Wafers having copper lines embedded into silicon dioxide and lines with a liner material are first subjected to CMP employing an aqueous slurry comprising about 2% by weight alumina, about 3% by weight $H_2O_2$, with the remainder being water and minor additives. After the CMP, the wafers are contacted with the above aqueous cleaning mixture.

Example 3

In a series of cleaning experiments, a subset of the following three different wafer types are employed to characterize the cleaning performance:
   a) oxidized silicon substrates, with the oxide formed by plasma-enhanced chemical vapor deposition (PECVD) using tetraethylorthosilicate (TEOS) precursor.
   b) thermally oxidized silicon substrates (TOX).
   c) silicon substrates covered with a thin film of TEOS oxide upon which is deposited 250 Å of Tantalum by physical vapor deposition (PVD) followed by 1 kÅ of PVD Cu.
   d) Patterned wafer films consisting of etch trenches in TEOS, followed by deposition of 250 Å of Tantalum by physical vapor deposition (PVD) followed by 1 kÅ of PVD Cu and then 10 kÅ of electroplated Cu.

These wafer types as detailed above are then preprocessed according to either of three different approaches as typically done in post-CMP clean characterization work.
   a) No slurry processing with the wafer type being subjected to subsequent cleaning only.
   b) The wafer type receiving only a dip in the CMP slurry and then subsequently cleaned.
   c) The wafer type receiving polishing on a production quality CMP tool and then subsequently cleaned.

The preprocessed wafers as detailed above are then cleaned (post-processed) according to either of two different approaches as typically done in post-CMP clean characterization work.
   a) cleaned using a double-sided brush scrubber
   b) cleaned using the immersion technique in a megasonic bath.

The cleaned (post processed) wafers as detailed above are then characterized using accepted metrology tools as typically done in post-CMP clean evaluation work including one or more of the following.
   a) Particle performance using light scattering metrology equipment
   b) Elemental analysis using transmission X-ray fluorescence (TXRF) equipment
   c) Elemental analysis using Drop Scan Etching (DSE) of the dissolved surface silicon dioxide coupled with inductively coupled plasma mass spectrometry (ICP-MS).
   d) Static etch rate for copper and silicon dioxide via sheet resistance by 4-pt probe and oxide thickness via ellipsometry, respectively
   e) Dynamic etch rate for copper and silicon dioxide via sheet resistance by 4-pt probe and oxide thickness via ellipsometry, respectively
   f) Surface roughness of copper and oxide via atomic force microscopy (AFM).

Example 4

In a separate experiment, blanket TEOS films are processed in order to quantify the particle-based and elemental-based cleaning performance of the use-concentration chemistry depicted in example 1. In all cases, TEOS films are first characterized by laser light scattering on a Tencor 6420 and Tencor SP1, to determine the particle precount at >0.2 µm and at >0.16 µm, respectively. The wafers are either sent directly through the scrubber-based cleaner without any slurry or CMP exposure, with only a slurry dip in either commercially available Cu or Ta slurry, or polished on an integrated CMP tool with the same slurry set. As seen in Table 1, the Tencor 6420 measurement tool indicates that the wafers improved their cleanliness in all cases. The slurry dip films are cleaned to the level of the wafer that is cleaned but without slurry exposure. The TEOS films which received CMP processing are also significantly cleaner, but show slightly higher post counts, which may be non-particulate defectivity introduced by the CMP process and thus, is not a clean chemistry issue.

TABLE 1

Light point defect counts, pre and post processing, using Tencor 6420 (>0.2 µm) and Tencor SP1 (>0.16 µm) on wafers without slurry exposure, with a slurry dip and with actual CMP processing.

| | | Tencor SP1 | | | Tencor 6420 | | |
|---|---|---|---|---|---|---|---|
| | LPDs | Pre | Post | Delta | Pre | Post | Delta |
| Slurry Dip | Al2O3 based - Cu Slurry | 290 | 53 | −243 | 38 | 12 | −26 |
| | SiO2 based - Ta Slurry | 24 | 10 | −14 | 10 | 3 | −7 |
| CMP | Al2O3 based - Cu Slurry | 348 | 452 | 104 | 98 | 43 | −55 |
| | SiO2 based - Ta Slurry | 226 | 983 | 757 | 61 | 35 | −26 |
| No Slurry | N/A | 433 | 45 | −388 | 174 | 9 | −165 |

A subset of the processed TEOS films are subsequently analyzed for surface elements on both wafer topside and backside using a Rigaku Model 3276 Total X-ray Fluorescence Spectroscopy tool at 3 measurement sites per wafer. Table 2 displays the corresponding wafer average results and detection limits by element. Note that the Cl and S levels are high and may either reflect a water quality issue at the experiment location or a genuine element issue. Metal element levels (Fe, Ni, Cu, Zn) for films which are slurry exposed are below 1 e11 at/cm$^2$ in all cases.

TABLE 2

Elemental analysis via TXRF on wafers processed without slurry exposure, with a slurry dip and with actual CMP processing, including smooth backside analysis. (All data is 1e10 at/cm2).

| | TXRF | Fe | Ni | Cu | Zn | CL | S | Ca |
|---|---|---|---|---|---|---|---|---|
| Slurry Dip | Al2O3 based - Cu Slurry | 9.9 | 6.5 | 1 | 3.4 | 818 | 175 | 5 |
| | SiO2 based - Ta Slurry | 9.6 | 6.3 | 2.2 | 1 | 1265 | 94 | 5 |
| CMP | Al2O3 based - Cu Slurry | 8.8 | 4.2 | 5.2 | 1.3 | 685 | 10 | 5 |
| | SiO2 based - Ta Slurry | 6.1 | 2.3 | 3.7 | 1 | 499 | 102 | 7.1 |

TABLE 2-continued

Elemental analysis via TXRF on wafers processed without slurry exposure, with a slurry dip and with actual CMP processing, including smooth backside analysis. (All data is 1e10 at/cm2).

| TXRF | | Fe | Ni | Cu | Zn | CL | S | Ca |
|---|---|---|---|---|---|---|---|---|
| No Slurry Cleaned Upside Down | N/A CuEa Slurries (Smooth Side TXRF) | 19.9 5.9 | 12.3 3.4 | 2.6 2.2 | 1 1 | 670 412 | 61 94 | 5 5 |
| Det Limit | N/A | 2 | 1 | 1 | 1 | 7.5 | 10 | 5 |

Example 5

In a separate cleaning experiment, a single cassette containing 24 wafers, each with a film stack of 1 kÅ PVD Cu/250 Å PVD Ta/TEOS/Si, is polished on a commercially available polishing platform with a two slurry process the first slurry is an alumina-based slurry for Cu removal while the second slurry is a silica-based slurry for Ta removal. The wafers are otherwise polished using traditional production consumables and process parameters to clear the metal from the TEOS. The wafers are subsequently cleaned in a standalone, double-sided brush scrubber using the composition and dilution specified in Example 1. Each wafer is characterized for post-CMP clean particles. Average post particle counts (light point defects) as measured using a Tencor 6420 with a detection threshold of about >0.2 µm is 8 adders with a standard deviation of less than 4 adders showing both capability and stability of performance. Table 3 displays the corresponding data for each wafer. The low post-count magnitude reflects the excellent slurry and slurry by-product particulate cleaning capability of the clean chemistry.

TABLE 3

Light Point Defect Counts via Tencor 6420

| Wafer # | | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| LPD >0.2 µm | 15 | 16 | 8 | 7 | 3 | 12 | 7 | 5 | 5 | 15 | 6 | 3 |

| Wafer # | | | | | | | | | | | | |
|---|---|---|---|---|---|---|---|---|---|---|---|---|
| | 13 | 14 | 15 | 16 | 17 | 18 | 19 | 20 | 21 | 22 | 23 | 24 |
| LPD >0.2 µm | 8 | 9 | 10 | 6 | 5 | 3 | 4 | 7 | 8 | 11 | 9 | 10 |

A 4 wafer subset of the processed TEOS films are subsequently analyzed for surface elements on both topside and backside using a Rigaku Model 3276 Total X-ray Fluorescence Spectroscopy tool at 3 measurement sites per wafer. Table 4 displays the corresponding wafer average results and detection limits by element.

TABLE 4

Elemental analysis via TXRF on 4 wafers (3 sites/wafer) processed without slurry exposure, with a slurry dip and with actual CMP processing, including backside analysis. (All data is 1e10 at/cm2)

| | Fe | Ni | Cu | Zn | Cl | S | Ca |
|---|---|---|---|---|---|---|---|
| Mean | 6.25 | 18.8 | 5.4 | 0 | 761 | 14.8 | 130 |
| Std. Dev. | 3.25 | 3.1 | 3.2 | 0 | 162 | 51.4 | 63.6 |
| Det Limit | 2 | 1 | 1 | 1 | 7.5 | 10 | 5 |

Note that the Cl and Ca levels are high and may reflect either a water quality issue at the experiment location or a genuine element issue. Metal element levels (Fe, Ni, Cu, Zn) for these-slurry exposed films were below 2e11 at/cm2 in all cases.

Example 6

In a separate experiment, the static etch rate (SER) and dynamic etch rate (DER) of the use concentration clean chemistry specified in Example 1 is evaluated on Cu and TEOS films, the results are shown in Table 5. For the static etch test, full 8" wafers are placed in quantities of the use-concentration chemistry (19 parts DI to 1 part concentrate) for 20 minutes, then subsequently rinsed with UHP DI and dried. For the dynamic etch test, wafers are run through a double-sided brush scrubber at the use-concentration for 20 minutes, rinsed and dried. The prescope and post-process thickness are determined for the Cu and TEOS films by 4-pt probe and ellipsometry, respectively. A low, but finite value of the etch rate is shown in all cases. The low etch rate magnitude of Cu prevents surface corrosion, grain, grain boundary and grain triple point and film interface attack. It also minimizes associated surface roughness. The low but finite TEOS etch rates help in removing a thin and potentially element contaminated layer of TEOS. The pH of the composition is sufficiently low to destabilize surface copper oxide, yet minimizes the direct attack of Cu metal, with the intent to yield as clean and smooth a Cu surface as possible.

TABLE 5

Etch Rate Data (Å/min) via 4-pt prove and ellipsometry

| | Cu | TEOS |
|---|---|---|
| SER | 4.5 | 3.0 |
| DER | 5.0 | 4.5 |

The polished and cleaned wafers are characterized with respect to surface finish using an atomic force microscope. Both blanket Cu and patterned films are polished using a silica-based slurry which polishes both Cu, Ta and TEOS blanket films at approximately the same rate. The blanket Cu film is partially polished using the silica-based slurry, buffed using UHP and $H_2O$ and immediately cleaned using the composition at use-concentration in a double-sided brush scrubber. The wafers are then transferred to a Thermomicroscopes model MS atomic force microscope. Two locations on each wafer are measured. For the patterned films an 80 µm×80 µm bond pad is chosen. Within this bond pad the RMS average roughness over a 2 µm×2 µm square is determined. For the blanket films, a random location of two 2 µm×2 µm measurement sites is utilized. In both cases, very low RMS roughness is obtained, consistent with the low static and dynamic etch rates measured in other experiments. Table 6 displays the actual values determined. We note that these values are very low, reflective of the low metal etch rate of the composition, and provides for a smooth surface finish.

TABLE 6

RMS Roughness (Angstroms) via M5 AFM

|  | Blanket | Patterned |
|---|---|---|
| Site 1 | 5.61 | 16.0 |
| Site 2 | 7.23 | 17.1 |

Example 7

In a separate example, a blanket thermally oxidized (TOX) silicon wafer is immersed in a megasonic tank filled with the composition from Example 1 after dipping it into a custom slurry product which is based upon an alumina abrasive and peroxide oxidizer system. The wafer is subsequently rinsed with UHP $H_2O$ and dried. The TOX wafer is characterized using a Digital Nanoscope III atomic force microscope (AFM), Tencor Surfscan full-wafer light-point-defect detector both pre- and post-processing. Particle adders are −77 at >0.2 μm via the Tencor Surfscan. Elemental analysis is performed using TXRF and indicated low levels, below the detection limits in almost all cases, with the exception of Fe, Ca and Zn which were close to the detection limit as shown in Table 7. The cleaning potential of the composition with respect to slurry abrasive particles and surface elemental contamination has been clearly evidenced.

TABLE 7

TXRF results

|  | K | Ca | Ti | Cr | Mn | Fe | Ni | Cu | Zn |
|---|---|---|---|---|---|---|---|---|---|
| Wafer 1 | <10 | 6 | <6 | <0.7 | 4.5 | 4.5 | 0.9 | <0.6 | 1.9 |
| Wafer 2 | <10 | 8 | 8 | <1 | <0.9 | 6.4 | 0.8 | <0.6 | 1.9 |

Example 8

In a separate experiment, 25 blanket TEOS dummy wafers and 3 test TEOS wafers are processed in order to quantify the particle-based and elemental-based cleaning performance of the use-concentration composition depicted in example 2. In all cases, test TEOS wafers are first characterized by laser light scattering on a Tencor 6420 to determine the particle pre-count at >0.2 μm. The wafers are sent directly through the stand-alone double-sided scrubber-based cleaning tool without any slurry or CMP exposure. As seen in Table 8, the Tencor 6420 measurement tool indicates that the wafers show low post-particle counts in all cases.

Subsequent to the 28 TEOS films, test wafer are subjected to a slurry dip and subsequently sent through the stand-alone scrubber. Such films show clean capability at the same level or better than those wafers that are cleaned but did not have an initial slurry exposure as shown in Table 8.

TABLE 8

Light point defect counts, pre and post processing, using Tencor 6420 (>0.2 μm) on wafers without slurry exposure and with a slurry.

|  |  | Tencor 6420 | | |
|---|---|---|---|---|
|  | LPDs | Pre | Post | Delta |
| No Slurry | Clean Only | 71 | 66 | −5 |
| No Slurry | Clean Only | 27 | 55 | 28 |
| No Slurry | Clean Only | 77 | 58 | −19 |
| Slurry Dip | SiO2 based - Ta Slurry | 35 | 41 | 6 |

A subset of the processed TEOS films are subsequently analyzed for surface elements on topside using a Rigaku Model 3276 Total X-ray Fluorescence Spectroscopy tool at 3 measurement sites per wafer. Table 9 displays the corresponding wafer average results and detection limits by element. Note that the Cl level is high and may reflect a water quality issue at the experiment location or a genuine element issue. Metal element levels (Fe, Ni, Cu) for films which are slurry exposed to slurry are below $1.0\,e11$ at/cm$^2$ in all cases.

TABLE 9

Elemental analysis via TXRF on wafers processed without slurry exposure and with a slurry dip. (All data is 1e10 at/cm2).

| TXRF |  | Fe | Ni | Cu | Cl | S | Ca |
|---|---|---|---|---|---|---|---|
| Slurry Dip | SiO2 based - Ta Slurry | 9.6 | 6.3 | 2.2 | 1265 | 94 | 5 |
| No Slurry | Clean Only | 5 | 16 | 4 | 742 | 10 | 60 |
|  | Det. Limit | 2 | 1 | 1 | 7.5 | 10 | 5 |

Example 9

In a separate cleaning experiment, two cassettes containing 30 wafers total, each wafer with the film stack of 1 kÅ PVD Cu/250 Å PVD Ta/TEOS/Si, are polished on a commercially available polishing platform with a Ta slurry process. The slurry is a silica-based slurry for Ta removal, but also has an appreciable Cu polish rate. The wafers are otherwise polished using traditional production consumables and process parameters to clear the metal from the TEOS. The wafers are subsequently cleaned in a stand-alone double-sided brush scrubber using the composition and dilution specified in Example 2. Each wafer is characterized for post-CMP clean particles. Average post particle counts (light point defects) as measured using a Tencor 6420 with a detection threshold of at >0.2 μm was 25.8 adders with a standard deviation of 26.6 adders showing both capability and stability of performance. Note, wafer 5 is removed from the analysis due to an observed misprocess. It is quite conceivable that other wafers are affected similarly, but since they were not analyzed by TXRF, it was not detected. Table 10 displays the corresponding data for each wafer. The low post count magnitude reflects the slurry and slurry by-product particulate cleaning capability and stability of the composition of the invention and associated process.

TABLE 10

| | Light Point Defect Counts via Tencor 6420 | | | | | | | | | | | | | | |
|---|---|---|---|---|---|---|---|---|---|---|---|---|---|---|---|
| | Waf. # | | | | | | | | | | | | | | |
| | 1 | 2 | 3 | 4 | 5 | 6 | 7 | 8 | 9 | 10 | 11 | 12 | 13 | 14 | 15 |
| LPD @ >0.2 μm | 11 | 15 | 16 | 109 | 30k | 15 | 10 | 7 | 11 | 6 | 19 | 17 | 19 | 34 | 38 |
| | Waf # | | | | | | | | | | | | | | |
| | 16 | 17 | 18 | 19 | 20 | 21 | 22 | 23 | 24 | 25 | 26 | 27 | 28 | 29 | 30 |
| LPD @ >0.2 μm | 44 | 39 | 30 | 28 | 23 | 18 | 21 | 30 | 120 | 4 | 8 | 21 | 8 | 11 | 5 |

A 2-wafer subset of the processed TEOS films are subsequently analyzed for surface elements on wafer topside using a Rigaku Model 3276 Total X-ray Fluorescence Spectroscopy tool at 3 measurement sites per wafer. Table 11 displays the corresponding wafer average results and detection limits by element.

TABLE 11

Elemental analysis via TXRF on 4 wafers (3 sites/wafer) processed without slurry exposure, with a slurry dip and with actual CMP processing, including backside analysis.
(All data is 1e10 at/cm2)

| | Fe | Ni | Cu | Zn | Cl | S | Ca |
|---|---|---|---|---|---|---|---|
| Mean | 5.92 | 14.3 | 3.2 | 1 | 754 | 21.7 | 61.9 |
| Std. Dev. | 3.7 | 3.0 | 1.9 | 1 | 145 | 32.5 | 33.6 |
| Det Limit | 2 | 1 | 1 | 1 | 7.5 | 10 | 5 |

Note that the Cl levels are again high and reflect either a water quality issue at the experiment location or a genuine element issue. Metal element levels (Fe, Ni, Cu, Zn) for these slurry-exposed films are below $2\ e11$ at/cm$^2$ in all cases and reflect the elemental cleaning capability of the compositions of the present invention.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A fluoride-free aqueous composition consisting of
   about 0.005 to about 16% by weight of at least two dicarboxylic acids, salt thereof or mixture thereof;
   about 0.003 to about 4% by weight of at least one hydroxyl carboxylic acid; and the remainder being substantially water; and
   having a pH of about 1 to about 4.

2. The composition of claim 1 wherein the dicarboxylic acid has two to six carbon atoms.

3. The composition of claim 1 wherein the dicarboxylic acid is selected from the group consisting of oxalic acid, malonic acid, succinic acid, glutaric acid, adipic acid, maleic acid and fumaric acid.

4. The composition of claim 1 wherein the dicarboxylic acid comprises a mixture of malonic acid and oxalic acid.

5. The composition of claim 4 wherein the amount of said malonic acid is about 0.003 to about 8% by weight and the amount of said oxalic acid is about 0.003 to about 8% by weight.

6. The composition of claim 1 wherein the hydroxyl carboxylic acid is selected from the group consisting of malic acid, tartaric acid and citric acid.

7. The composition of claim 1 wherein the hydroxyl carboxylic acid is citric acid.

* * * * *